United States Patent
Matsumoto et al.

[11] Patent Number: 5,599,741
[45] Date of Patent: Feb. 4, 1997

[54] METHOD FOR MAKING SEMICONDUCTOR DEVICE WITH METAL DEPOSITED ON ELECTRON DONATING SURFACE OF GATE ELECTRODE

[75] Inventors: Shigeyuki Matsumoto, Atsugi; Hiroshi Yuzurihara, Isehara; Mamoru Miyawaki, Tokyo; Shunsuke Inoue; Jun Nakayama, both of Atsugi, all of Japan

[73] Assignee: Cannon Kabushiki Kaisha, Tokyo, Japan

[21] Appl. No.: 479,385

[22] Filed: Jun. 7, 1995

Related U.S. Application Data

[62] Division of Ser. No. 325,644, Oct. 19, 1994, abandoned, which is a continuation of Ser. No. 46,366, Apr. 13, 1993, abandoned, which is a continuation of Ser. No. 707,032, May 29, 1991, abandoned.

[30] Foreign Application Priority Data

May 31, 1990 [JP] Japan ................................. 2-143734
Jun. 4, 1990 [JP] Japan ................................. 2-144543

[51] Int. Cl.⁶ ............................ H01L 21/44; H01L 21/22
[52] U.S. Cl. ...................... 437/192; 437/194; 437/154; 437/155; 437/246; 437/44
[58] Field of Search ........................... 357/23.4, 23.9; 257/336, 344, 346, 388, 408, 412, 413; 437/192, 194, 155, 198, 246, 154, 44, 41 RLD

[56] References Cited

U.S. PATENT DOCUMENTS

| | | |
|---|---|---|
| 4,356,623 | 11/1982 | Hunter . |
| 4,570,328 | 2/1986 | Price et al. . |
| 4,597,824 | 7/1986 | Shinada et al. ........................ 156/643 |
| 4,722,909 | 2/1988 | Parrillo et al. ........................... 437/44 |
| 4,737,823 | 4/1988 | Brown .................................... 357/23.1 |
| 4,755,478 | 7/1988 | Abernathy et al. ....................... 437/41 |
| 4,908,332 | 3/1990 | Wu ......................................... 437/192 |
| 4,920,403 | 4/1990 | Chow et al. . |
| 4,975,385 | 12/1990 | Beinglass et al. ......................... 437/44 |
| 5,010,030 | 4/1991 | Pfiester et al. ......................... 437/192 |
| 5,031,008 | 7/1991 | Yoshida ................................ 357/23.9 |
| 5,116,774 | 5/1992 | Huang et al. ............................ 437/40 |
| 5,218,232 | 6/1993 | Yuzurihara et al. . |
| 5,328,873 | 7/1994 | Mikoshiba et al. ..................... 437/187 |

FOREIGN PATENT DOCUMENTS

| | | |
|---|---|---|
| 0459770 | 12/1991 | European Pat. Off. . |
| 59-102189 | 12/1985 | Japan . |
| 61-202467 | 9/1986 | Japan ..................................... 257/413 |
| 01252776 | 10/1989 | Japan . |
| 2304935 | 12/1990 | Japan . |
| 3104235 | 5/1991 | Japan . |
| 2195663 | 4/1988 | United Kingdom . |

OTHER PUBLICATIONS

Shigeeda, N. "Selective and Nonselective Deposition of Al by LPCVD using DMAH" Record of Elec. & Commun. Eng. Converaszione Tokyo Univ. (May 1990) vol. 58 No. 4 pp. 27–28. Abstract only.

H. O. Pierson, "Aluminum Coatings in the Decomposition of Alkyls", *Thin Solid Films*, 45, 256–63 (1977) Jan.

C. Bernard et al., "Chemical Vapor Deposition of Refractory Metal Silicides for VLSI Metallization", *Solid State Tech.*, 32, 79–84 (Feb. 1989).

*Primary Examiner*—George Fourson
*Assistant Examiner*—C. Everhart
*Attorney, Agent, or Firm*—Fitzpatrick, Cella, Harper & Scinto

[57] ABSTRACT

A semiconductor device including a field effect transistor has source and drain areas formed on the main surface of a semiconductor substrate and a gate electrode formed on the main surface across a gate insulation film. The gate electrode has a first electrode portion with an electron donating surface and a second electrode portion consisting of metal formed on the first electrode portion.

8 Claims, 9 Drawing Sheets

METHOD FOR MAKING SEMICONDUCTOR DEVICE WITH METAL DEPOSITED ON ELECTRON DONATING SURFACE OF GATE ELECTRODE

This application is a division of application Ser. No. 08/325,644, filed Oct. 19, 1994, now abandoned; which is a continuation of application ser. No. 08/046,366 filed filed Apr. 13, 1993, now abandoned; which in turn, is a continuation of application Ser. No. 07/707,032, filed May 29, 1991, now abandoned.

BACKGROUND OF THE INVENTION

1. Field of the Invention

The present invention relates to a semiconductor device such as a memory, a photoelectric converter device, a signal processing device or the like, for use in various electric appliances, and a method for producing the same.

2. Related Background Art

In recent efforts toward attaining the higher level of device integration, there has been a desire for the development of miniaturized functional devices such as a MOS transistor with submicron gate length. On the other hand, an improvement in the voltage resistance characteristics is desired, as such miniaturization tends to cause concentration of the electric field in the vicinity of the drain. In order to prevent the avalanche breakdown in the vicinity of the drain when a high voltage is applied thereto, there has been employed a light doped drain (LDD) structure, in which a drain area of a low doping concentration is formed adjacent to the drain area, thereby relaxing the electric field around the drain.

Figure 1A:
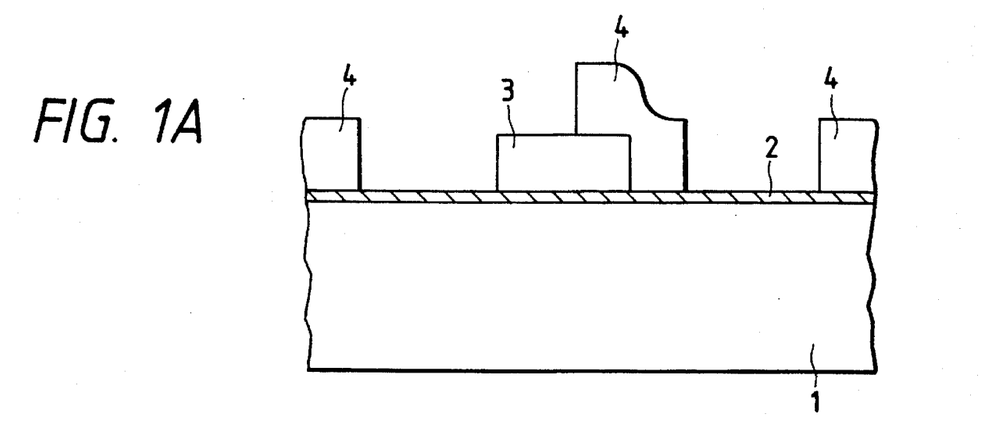
FIGS. 1A to 1C are cross-sectional views showing a conventional structure.
Figure 1B:
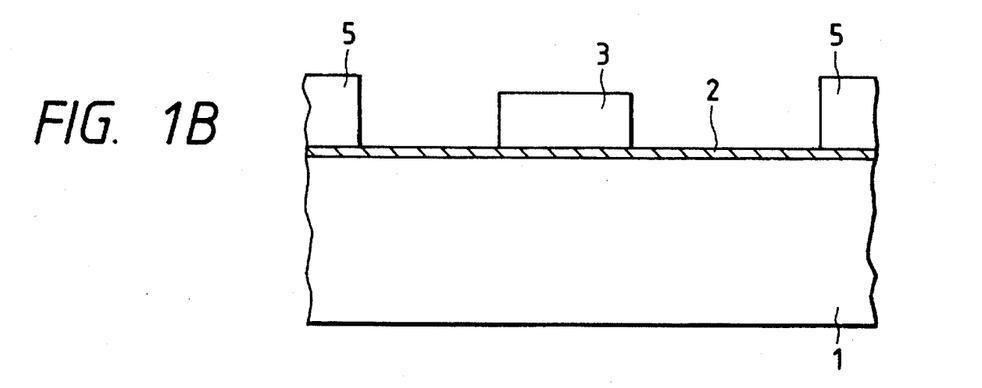
Figure 1C:
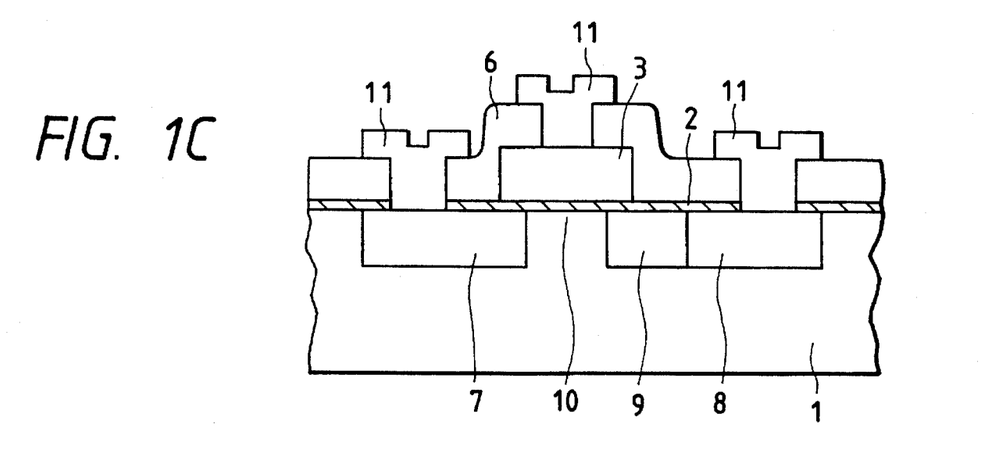

FIGS. 1A to 1C schematically illustrate the conventional process for forming the drain area of low doping concentration. At first, as shown in FIG. 1A, a gate insulation film 2 is formed on a silicon substrate 1, then a polycrystalline silicon gate film 3 and a photoresist layer 4 are patterned, and phosphorus is implanted with a high concentration, utilizing the photoresist 4 as a mask.

Then as shown in FIG. 1B, a photoresist pattern 5 is formed, and phosphorus is implanted with a low concentration, utilizing said photoresist 5 as a mask. Finally, as shown in FIG. 1C, an intermediate insulation film 6 is formed by an ordinary method, and an annealing treatment is applied. There are thus conducted formation of a source area 7, a high-concentration drain area 8, a low-concentration drain area 9, a channel area 10 and electrodes 11.

In the above explained conventional example, however, the low-concentration drain area 9 is formed, after the impurity implantation into the silicon substrate 1 through the photoresist mask for forming the drain area 8, by implanting an impurity of the same conductive type as that of the drain area 8 into an area of the silicon substrate 1 between the drain area 8 and the channel area 10. Consequently, depending on the accuracy of alignment, the width of said low-concentration drain area 9, present between the channel area 10 and the drain area 8, fluctuates inevitably, so that a fluctuation in the drain voltage resistance has been unavoidable, as will be explained later.

Figure 2A:
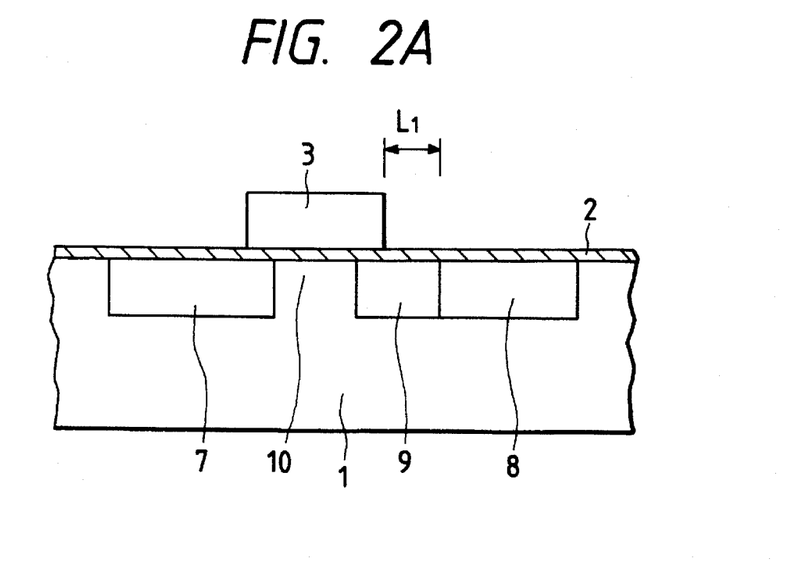
FIGS. 2A and 2B are views showing the relationship between the offset and the drain voltage resistance.
Figure 2B:
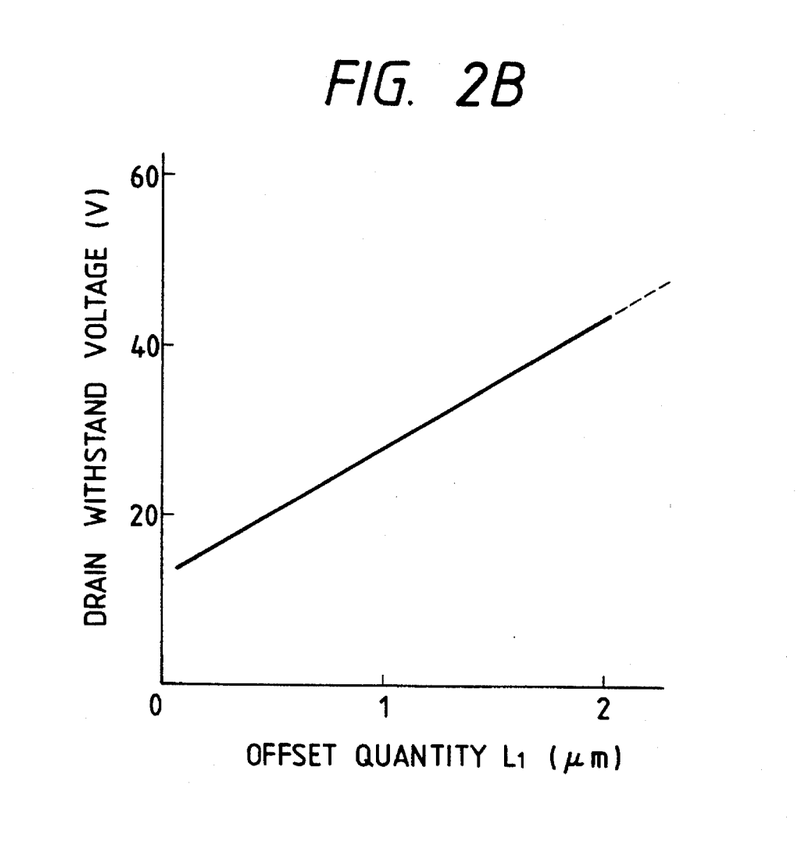

FIGS. 2A and 2B show the relationship between the offset and the drain voltage resistance, wherein the offset L1 is, as shown in FIG. 2A, the distance from a lateral wall of a gate 3 to the boundary between the low-concentration drain area 9 and the high-concentration drain area 8. As shown in FIG. 2B, the drain voltage resistance increases linearly with said offset L1. In the conventional process, the standard deviation of the precision of alignment is 0.3 μm. Consequently the offset L1 inevitably involves a fluctuation of 0.3 μm, which brings about a fluctuation of about 5 V in the drain voltage resistance.

On the other hand, for reducing the signal delay time, it has been proposed to form the gate electrode and its wiring with silicide (silicon metal alloy) or with a polycide structure (laminate structure of polycrystalline silicon and silicide film) thereby reducing the specific resistivities thereof.

However, such silicide or polycide structure of the gate for achieving a high speed still requires improvements in the following areas, in order to achieve production of the currently required miniaturized semiconductor devices of high-speed function with a high production yield. More specifically, the conventional silicide structure has been associated with the following drawbacks:

(1) that the threshold voltage ($V_{th}$) of the MOS device varies depending on the work function of the silicide; and
(2) that a metal from the silicide diffuses into the gate oxide film 5, thereby deteriorating the MOS transistor.

On the other hand, the polycide structure has also been associated with the following drawbacks:

(3) that the specific resistivity can only be reduced to ca. 3 $\Omega/\square$; and
(4) that an insulation film or a precipitated impurity film, if present at the interface between the polycrystalline silicon and silicide, may result in a significant deterioration of the gate voltage resistance or a peeling of the silicide film, called pest phenomenon.

SUMMARY OF THE INVENTION

An object of the present invention is to provide a semiconductor device capable of resolving the above-mentioned drawbacks of the prior art and allowing the formation of the low-concentration drain area with satisfactory precision in a self-aligning manner, thereby improving the drain voltage resistance.

Another object of the present invention is to provide a semiconductor device employing a field effect transistor capable of avoiding the above-mentioned drawback in the signal delay time in the wiring in the prior art and improving the response speed.

The above-mentioned objects can be attained, according to an embodiment of the present invention, by a method for producing a semiconductor device comprising a step of forming, on a first insulation film formed on the surface of a semiconductor substrate, a first layer of which the principal component is the same as that of said semiconductor substrate, a step of forming a second insulation film on said first layer and exposing the lateral surface of said first layer by patterning, a step of depositing a second layer of a metal selectively on the lateral surface of said first layer, a step of doping said semiconductor substrate with an impurity of a high concentration utilizing said second layer as a part of the mask, and a step of removing said second layer and doping said semiconductor substrate with an impurity of a low concentration utilizing said first layer as a part of the mask.

In the above-mentioned embodiment, the high-concentration drain area is formed by depositing a metal selectively on the lateral face of the polycrystalline silicon gate and utilizing said metal layer, and the low-concentration drain area is formed after said metal layer mask is removed. The selective deposition of the metal layer on the lateral face of the gate is conducted with a special CVD method, allowing precise thickness control and providing a deposited metal layer with satisfactory crystalline character and with an extremely flat surface. It is therefore possible to form the low-concentration drain area with an improved precision and to improve the drain voltage resistance.

Also the above-mentioned objects can be attained, according to the another embodiment of the present invention, by a semiconductor device including a field effect transistor provided with a source area and a drain area, formed on the main surface of a semiconductor substrate, and a gate electrode formed above said main surface across a gate insulation film, wherein said gate electrode includes a first electrode portion principally composed of a component the same as that of said semiconductor substrate, and a second electrode portion of a metal formed on the upper and lateral faces of said first electrode portion.

Also, according to said embodiment, there is provided a method for producing said semiconductor device, comprising the steps of forming a first electrode portion principally composed of a component the same as that of said semiconductor substrate for forming said gate electrode, then selectively depositing a metal on the upper and lateral faces of said first electrode portion, and implanting an impurity substance, and utilizing said metal as the mask.

The above-explained structure makes it possible to produce the lateral face film serving as a mask, in uniform and reproducible manner, by selective deposition of a metal on the upper and lateral faces for example of a polycrystalline silicon gate electrode and without relying on an etch-back process, so that even a relatively complex LDD structure as the countermeasure for hot electrons can be stably manufactured with a high production yield. A semiconductor device of an improved response speed can be provided as the specific resistivity of the gate electrode and the wiring can be significantly reduced by a laminate structure consisting of polycrystalline silicon and a metal film. For example, in a 0.8 μm gate, the alloy layer in the conventional polycide structure has a width of 0.8 μm, while the metal layer in the above-explained embodiment has an almost doubled width, thereby being capable of reducing the specific resistivity to about half, since the metal layer is present also on the lateral faces. The specific resistivity can be reduced further because the pure metal partially remains instead of the silicon-metal alloy in case of the polycide structure, so that a MOS device of a high response speed can be stably obtained.

DETAILED DESCRIPTION OF THE PREFERRED EMBODIMENTS

The present invention is to provide, in a preferred embodiment, improvements on the threshold voltage, gate resistance and gate voltage resistance in a gate electrode of an insulated-gate transistor, by forming said gate electrode with a first electrode portion principally composed of a component the same as that of the semiconductor substrate and a second electrode portion of a metal on the upper and lateral faces of said first electrode portion. It also provides an easy method for producing the gate electrode of such structure, without utilizing a mask, by selective deposition of a metal onto the first electrode portion.

Said method particularly enables the production of a transistor with the LDD structure at a low cost and with a high production yield, as it allows the formation of a low impurity concentration area by a self alignment step utilizing the first electrode portion as a mask, and the formation of a high impurity concentration area by a self alignment step utilizing the second electrode portion as a mask.

This method will be explained in greater detail in the following with reference to FIGS. 3A to 3D, in which a part of an N-channel MOS transistor is taken as the example. However, but the present invention is not limited to such example.

Figure 3A:
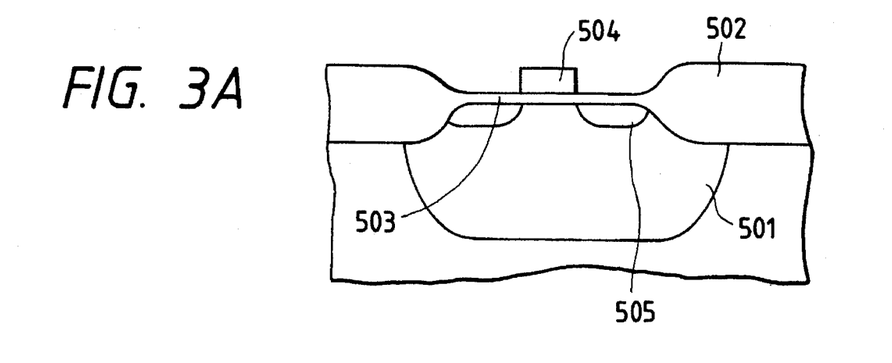
FIGS. 3A to 3D are schematic views showing the process for producing a semiconductor device of the present invention.

Initially, on a main surface of a silicon substrate, there are formed a P-well 501, an active area therein defined by a field oxide film 502, and a gate electrode 504 of polycrystalline silicon, provided on a gate oxide film 503, by means of ordinary thermal oxidation, LOCOS, thermal diffusion, polycrystalline deposition, photolithography etc. known in the semiconductor technology.

Then impurity ions are implanted, utilizing the gate electrode 504 as the mask, to form a diffusion area 505 of a low impurity concentration (FIG. 3A).

Figure 3B:
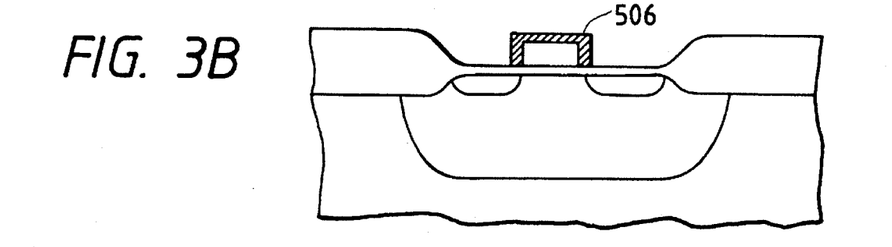

Subsequently a tungsten film 506 is selectively deposited solely on the upper and lateral faces of the polycrystalline silicon film 504, utilizing for example W(CH$_3$)$_3$ and H$_2$ as the reaction gases (FIG. 3B).

Figure 3C:
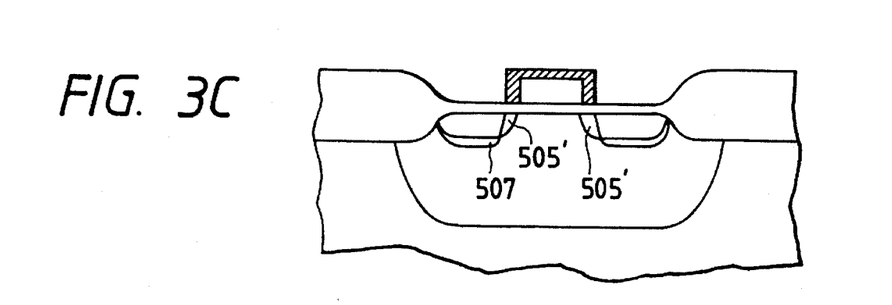

Then ion implantation is conducted with the tungsten film 506 as the mask, thereby protecting an area 505' covered by the tungsten film 506 from the impurity implantation and thus forming a high impurity concentration diffusion area 507 in a position retracted from the lateral face of the polycrystalline silicon film 504 (FIG. 5C).

Figure 3D:
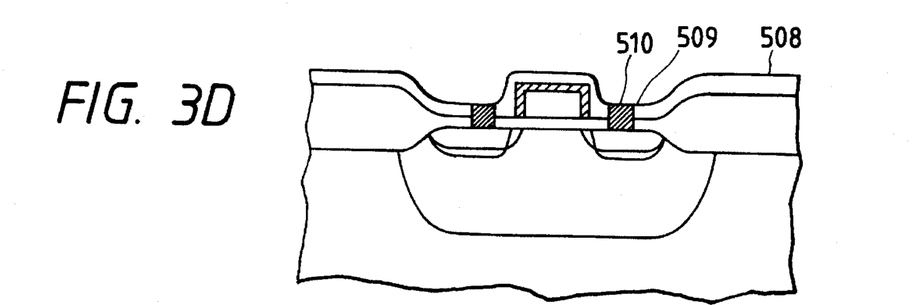

Then an interlayer insulation film 508 is deposited, and contact holes 509 are opened, at the positions of source/drain electrodes, by an ordinary patterning method used in the semiconductor process. Subsequently aluminum is selectively deposited into the contact holes 509, utilizing for example alkylaluminum hydride such as DMAH and H$_2$ gas (FIG. 3D).

The MOS transistor with the LDD structure can be completed by thereafter forming unrepresented wirings for example by sputtering.

Figure 4A:
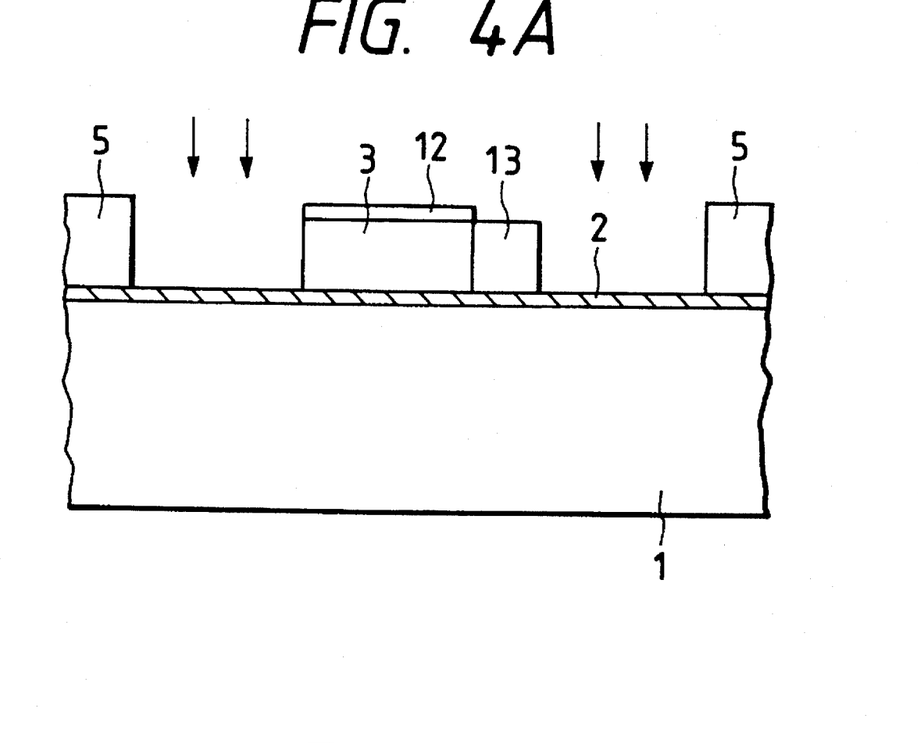
FIGS. 4A and 4B are schematic cross-sectional views of a preferred embodiment of the present invention.
Figure 4B:
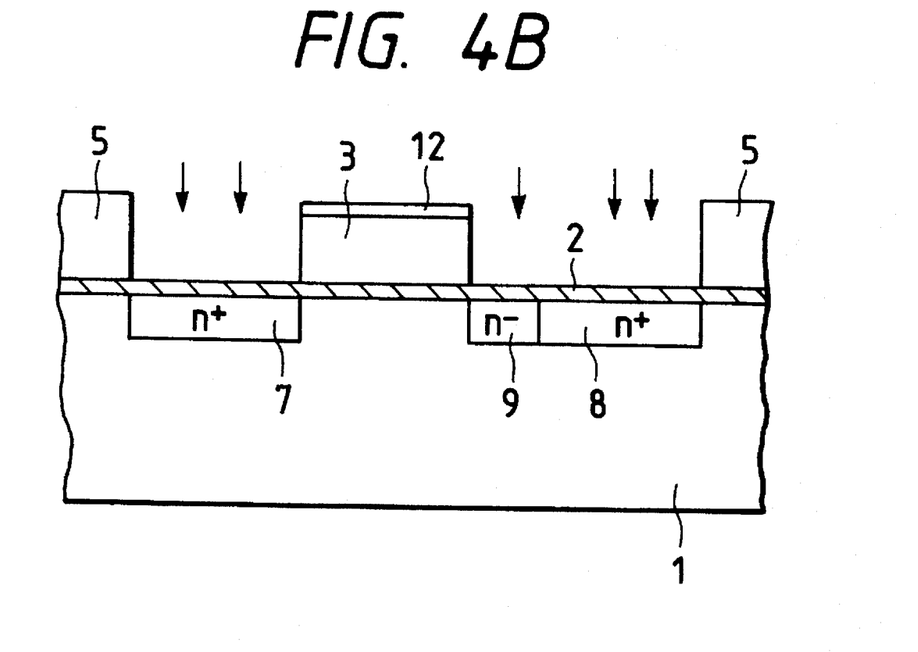

FIGS. 4A and 4B are schematic cross-sectional views showing a preferred embodiment of the present invention.

On a semiconductor substrate 1, there are formed an insulation film 2, then a first layer 3 principally composed of a component the same as that of said semiconductor substrate 1, and an oxide film 12 on the surface of said first layer, and the first layer is patterned into a desired shape. The semiconductor substrate 1 is composed for example of silicon, and the first layer 3 is composed for example of polycrystalline silicon. Then, on the lateral faces of the first layer 3, a second metal layer 13 is selectively deposited by a novel CVD method which will be explained in detail later. Then a photoresist layer 5 is provided for defining a high concentration doped area, and an impurity of a high concentration is introduced for example by ion implantation to form a high concentration doped area 8.

Subsequently, as shown in FIG. 4B, the metal layer 13 is removed, and an impurity of a low concentration is implanted to form a low concentration doped area 9. Though FIG. 4B shows n-type doping, p-type doping is also naturally possible. The metal layer 13 used as the mark can be advantageously composed of Al, Al alloys, Cu, W, Mo or alloys thereof.

(Description of Al-CVD method)

The Al-CVD method will be explained in the following, principally on the metal deposition in an aperture, but this method is applicable within the technical concept of the present invention, and the following description will be effective in understanding the superiority of the film quality obtained by said method.

(Film forming method)

This film forming method is suitable for forming the metal mask of the above-explained structure.

This method consists of forming a deposited film by a surface reaction on an electron donating substrate, utilizing alkylaluminum hydride gas and hydrogen gas (hereinafter called Al-CVD method).

An aluminum film of satisfactory quality can be deposited by heating the surface of the substrate in the presence of a gaseous mixture particularly consisting of alkylaluminum hydride such as monomethylaluminum hydride (MMAH) or dimethylaluminum hydride (DMAH) as the raw material gas and hydrogen gas as the reaction gas. At the selective deposition of aluminum, the surface temperature of the substrate is preferably maintained, by direct or indirect heating, within a range from the decomposition temperature of alkylaluminum hydride to 450° C., more preferably from 260° to 440° C.

The heating of the substrate in the above-mentioned temperature range may be achieved by direct or indirect heating, but formation of an Al film of satisfactory quality can be achieved with a high deposition speed, particularly by direct heating. For example, with the more preferred temperature range of 260°–440° C., a satisfactory film can be obtained with a deposition speed of 300–5000 Å/min. which is higher than in the resistance heating. Such direct heating (substrate being heated by direct transmission of energy from the heting means) can be achieved by heating with a lamp such as a halogen lamp or a xenon lamp. Also indirect heating may be achieved for example by resistance heating, conducted by a heat generating member provided in a substrate support member, for supporting the substrate to be subjected to film deposition, provided in a film deposition space.

This method, if applied to a substrate having both an electron donating surface area and an electron non-donating surface area, allows the forming of a single crystal of aluminum with satisfactory selectivity solely on the electron donating surface area. Such aluminum is excellent in all the properties required for the electrode/wiring material, including a low hillock frequency and a low alloy spike frequency.

The electron donating surface means a surface formed by an electron donating material, and the electron non-donating surface means a surface formed by an electron non-donating material. These materials will be explained in detail in the following. The electron donating material means a material in which free electrons are present or intentionally generated and which has a surface capable of accelerating a chemical reaction by electron transfer with the molecules of raw material gas deposited onto said surface. In general metals and semiconductive materials fall into this category. Also metals and semiconductors having a thin oxide film on the surface belong to the electron donating materials of the present invention since a chemical reaction can take place by electron transfer between the substrate and the deposited molecules of the raw material. Examples of such electron donating material include III–V compound semiconductors of two-, three- or multiple-element system obtained by combining element(s) of the group III such as Ga, In, Al etc. and element(s) of the group V such as P, As, N etc.; P, I and N-type semiconductors such as monocrystalline silicon and amorphous silicon; and metals, alloys and silicides such as tungsten, molybdenum, tantalum, copper, titanium, aluminum, titanium-aluminum, titanium nitride, aluminum-silicon-copper, aluminum-palladium, tungsten silicide, titanium silicide, aluminum silicide, molybdenum silicide and tantalum silicide.

On the other hand, the electron non-donating material is a material forming a surface not causing selective deposition of Al or Al—Si, and examples of such material include silicon oxide formed by thermal oxidation or CVD; glasses, oxide films and thermal nitride films such as BSG, PSG and BPSG; and silicon nitride formed by plasma CVD, low pressure CVD or ECR-CVD.

Such excellent properties are obtained presumably because the semiconductive or conductive surface constituting an electron donating surface can selectively develop an aluminum film of satisfactory quality, and excellent crystalline character of said Al film excludes or significantly reduces the alloy spike formation etc. resulting from an eutectic reaction with the underlying silicon. Such Al film, when employed as an electrode of a semiconductor device, provides advantages far exceeding the concept of the conventional Al electrode and not anticipated in the prior art.

As explained above, the Al deposited in an aperture with an electron donating surface, for example an aperture formed in an insulating film and exposing the surface of a semiconductor substrate therein, has a monocrystalline structure. Besides said Al-CVD method can achieve selective deposition of following metal films principally composed of aluminum, with similarly satisfactory quality.

For example, the electrode may be formed by selective deposition of various conductive materials such as Al—Si, Al—Ti, Al—Cu, Al—Si—Ti or Al—Si—Cu by the use of a mixed gaseous atmosphere employing, in addition to alkylaluminum hydride gas and hydrogen, a suitable combination of:

Si-containing gas such as $SiH_4$, $Si_2H_6$, $Si_3H_8$, $Si(CH_3)_4$, $SiCl_4$, $SiH_2Cl_2$ or $SiHCl_3$;

Ti-containing gas such as $TiCl_4$, $TiBr_4$ or $Ti(CH_3)_4$; and/or

Cu-containing gas such as copper bisacetylacetonate $Cu(C_5H_7O_2)_2$, copper bisdispyvaloylmethanite $Cu(C_{11}H_{19}O_2)_2$, or copper bishexafluoroacetylaceonate $Cu(C_5HF_6O_2)_2$.

Also, since said Al-CVD method is excellent in selectivity and provides satisfactory surface characteristics on the deposited film, there can be obtained a metal film suitable and widely usable for the wirings of a semiconductor device, by employing a non-selective film forming method in a deposition step to form a metal film composed solely or principally of aluminum not only on the selectively deposited aluminum film mentioned above but also on the $SiO_2$ insulation film.

Examples of such metal films include combinations of selectively deposited Al, Al—Si, Al—Ti, Al—Cu, Al—Si—Ti or Al—Si—Cu and non-selectively deposited Al, Al—Si, Al—Ti, Al—Cu, Al —Si—Ti or Al—Si—Cu. Said non-selective film deposition may be achieved by CVD other than the aforementioned Al—CVD, or by sputtering.

(Film forming apparatus)

In the following there will be explained a film forming apparatus suitable for the electrode formation according to the present invention.

Figure 5:
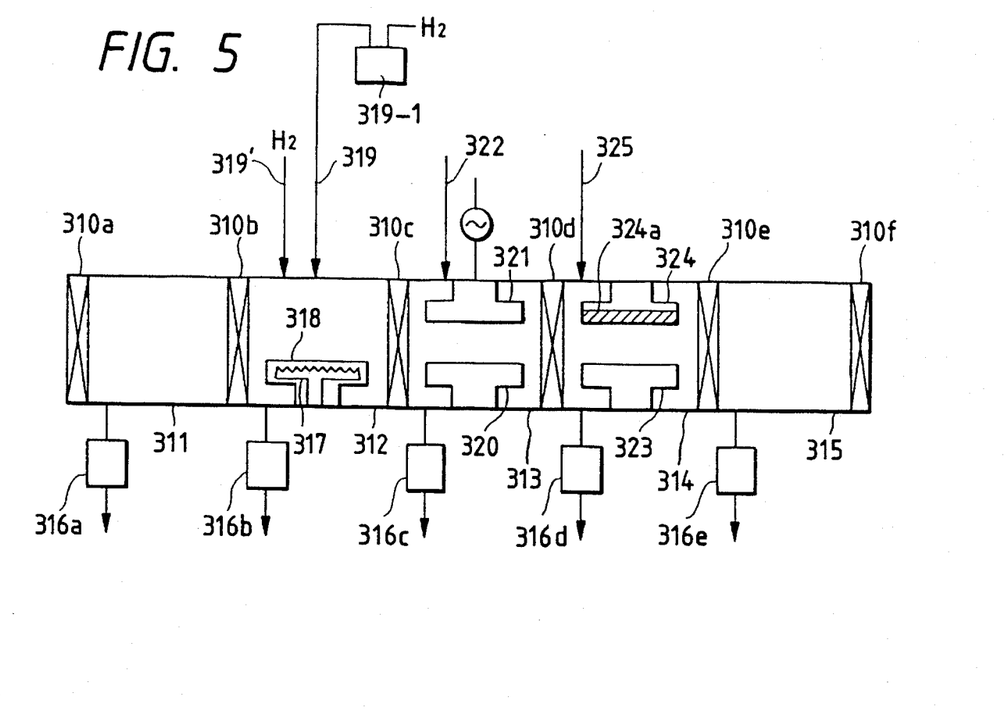
FIGS. 5 to 8 are views showing an example of the apparatus adapted for use in the producing method of the semiconductor device of the present invention.
Figure 6:
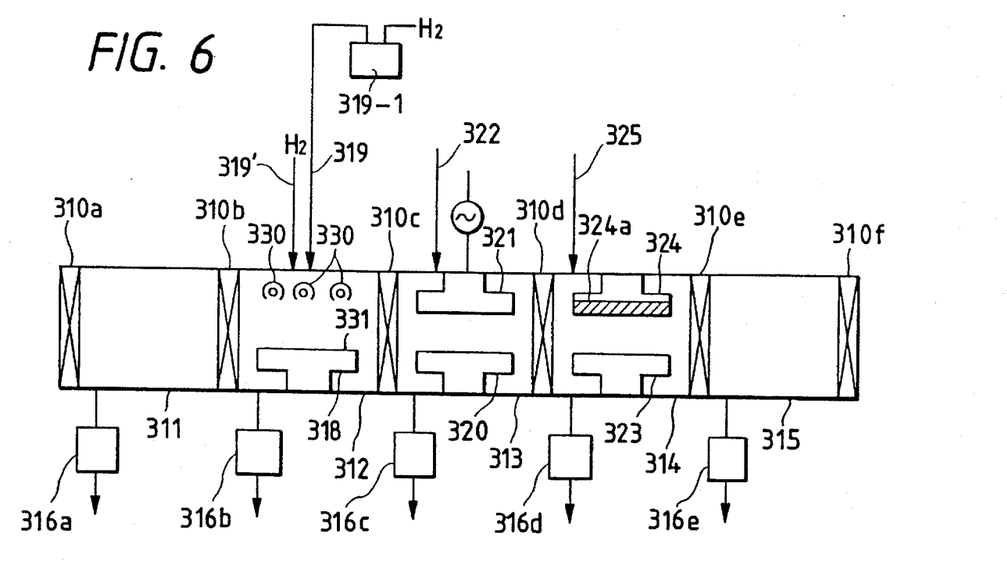
Figure 7:
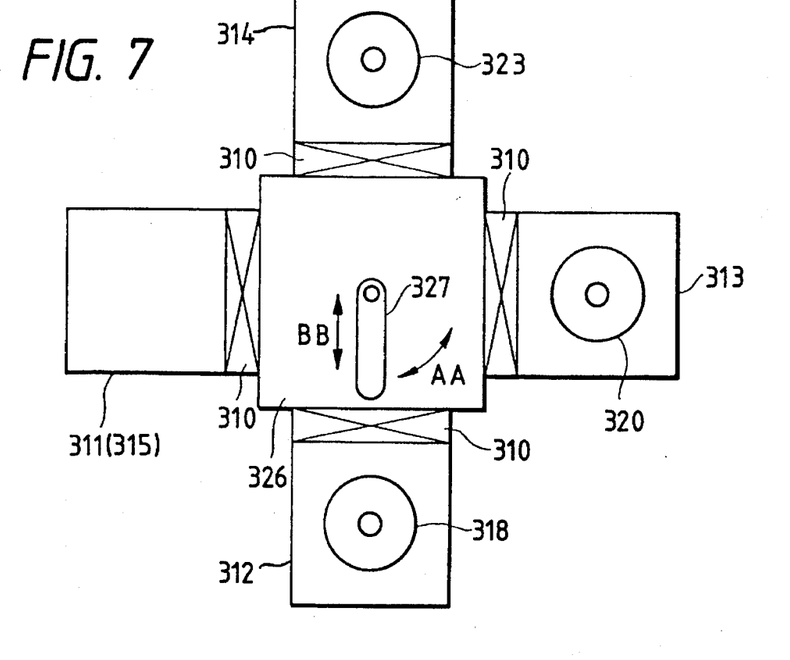
Figure 8:
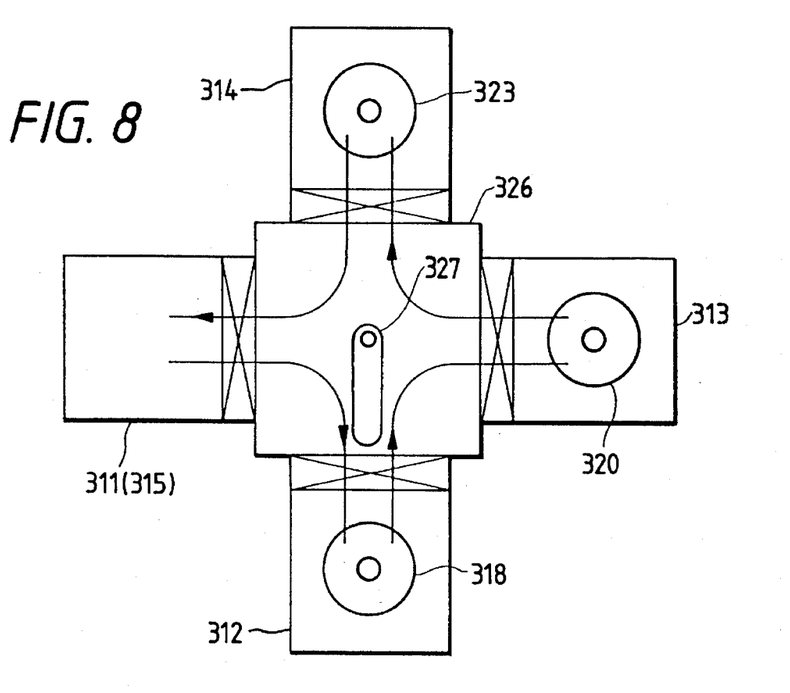

FIGS. 5 to 7 schematically illustrate a continuous metal film forming apparatus suitable for executing the film forming method explained above.

As shown in FIG. 5, said apparatus is composed of a load lock chamber 311, a CVD reaction chamber (first film forming chamber) 312, an Rf etching chamber 313, a sputtering chamber (second film forming chamber) 314 and a load lock chamber 315, which are rendered sealable from the external atmosphere and mutually communicatable by means of gate valves 310a–310f and can be respectively made vacuum or reduced in pressure by vacuum systems 316a–316e. The load lock chamber 311 is used for eliminating the atmosphere of substrate and replacing it with $H_2$ prior to the deposition, in order to improve the throughput. The next CVD reaction chamber 312, for selective deposition onto the substrate under normal or reduced pressure, is provided therein with a substrate holder 318 with a resistance heater 317 for heating the substrate surface subjected to film formation at least within a temperature range of 200°–450° C., and receives the raw material gas such as of alkylaluminum hydride, which is gasified by bubbling with hydrogen in a bubbler 319-1, through a raw material gas supply line 319, and hydrogen as the reaction gas through a gas line 319'. The Rf etching chamber 313, for cleaning (etching) of the substrate surface in Ar atmosphere after the selective deposition, is provided therein with a substrate holder 320 capable of heating the substrate at least within a range of 100°–250° C. and an Rf etching electrode line 321, and is connected to an Ar gas supply line 322. The sputtering chamber 314, for non-selective deposition of a metal film by sputtering in Ar atmosphere, is provided therein with a substrate holder 323 to be heated at least within a range of 200°–250° C. and a target electrode 324 for mounting a sputtering target 324a, and is connected to an Ar gas supply line 325. The final load lock chamber 315, for adjustment of the substrate after metal film deposition and prior to the exposure to the external atmosphere, is designed to be capable of replacing the atmosphere with $N_2$.

FIG. 6 shows another example of the continuous metal film forming apparatus, wherein same components as those in FIG. 5 are represented by same numbers. The apparatus in FIG. 6 is different from that in FIG. 5 in that the substrate surface is directly heated by halogen lamps 330, and, for this purpose, the substrate holder 312 is provided with projections 331 for supporting the substrate in a floating state.

Direct heating of the substrate surface with such structure further increases the deposition speed as explained before.

The continuous metal film forming apparatus of the above-explained structure is equivalent, in practice, to a structure shown in FIG. 7, in which the load lock chamber 311, CVD reaction chamber 312, Rf etching chamber 313, sputtering chamber 314 and load lock chamber 315 are mutually combined by a transport chamber 326. In this structure, the load lock chamber 311 serves also as the chamber 315. In said transport chamber 326, there is provided an arm 327 constituting transport means, rotatable in both directions A—A and extendable and retractable in directions B—B, whereby the substrate can be transferred in succession from the load lock chamber 311 to the CVD reaction chamber 312, Rf etching chanmber 313, sputtering chamber 314, and finally to the load lock chamber 315 without exposure to the external atmosphere, as indicated by arrows in FIG. 5.

(Film forming process)

Now there will be explained the film forming process for forming the electrodes and wirings according to the present invention.

FIGS. 9A to 9E are schematic perspective views showing the film forming procedure for forming the electrodes and wirings according to the present invention.

At first the outline of the procedure will be described. A semiconductor substrate with an insulating film, having apertures therein, is placed in the film forming chamber, and the surface thereof is maintained for example at 250°–450° C. Thermal CVD conducted in a mixed atmosphere of DMAH gas as alkylaluminum hydride and hydrogen gas causes selective deposition of Al on the semiconductor exposed in the apertures. There may naturally be conducted selective deposition of a metal film principally composed of Al, for example Al—Si, by introduction for example of Si-containing gas, as explained before. Then a metal film composed solely or principally of Al is non-selectively formed by sputtering, on the selectively deposited Al and on the insulation film. Subsequently the non-selectively deposited metal film is patterned into the shape of desired wirings, thereby obtaining the electrodes and the wirings.

This procedure will be explained in greater detail with reference to FIGS. 6 and 9A to 9E. Initially, a substrate is prepared, consisting for example of a monocrystalline silicon wafer bearing thereon an insulation film, in which apertures of different sizes are formed.

Figure 9A:
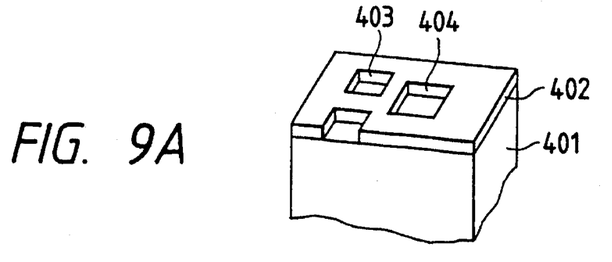
FIGS. 9A to 9E are schematic perspective views showing the steps of forming a first wiring layer in the method for producing the semiconductor device according to the present invention.

FIG. 9A schematically illustrates a part of said substrate, wherein shown are a monocrystalline silicon substrate 401 constituting a conductive substrate; a thermal silicon oxide film 402 constituting an insulation film; and apertures 403, 404 of different sizes.

The formation of Al film, constituting a first wiring layer, on the substrate is conducted in the following manner, with the apparatus shown in FIG. 6.

At first the above-explained substrate is placed in the load lock chamber 311, in which hydrogen atmosphere is established by introduction of hydrogen as explained before. Then the reaction chamber 312 is evacuated by the vacuum system 316b approximately to $1\times10^{-8}$ Torr, though Al film formation is still possible at a higher pressure.

Then DMAH gas obtained by bubbling is supplied from the gas line 319, utilizing $H_2$ as the carrier gas.

Also hydrogen as the reaction gas is introduced from the second gas line 319', and the interior of the reaction chamber 312 is maintained at a predetermined pressure, by the adjustment of an unrepresented slow leak valve. A typical pressure is about 1.5 Torr. DMAH is introduced into the reaction chamber from the DMAH line, with a total pressure of about 1.5 Torr and a DMAH partial pressure of about $5.0 \times 10^{-3}$ Torr. Then the halogen lamps 330 are energized to directly heat the wafer, thereby causing selective Al deposition.

After a predetermined deposition time, the DMAH supply is interrupted. Said deposition time is so selected that the Al film on Si (monocrystalline silicon substrate 1) becomes equally thick as $SiO_2$ (thermal silicon oxide film 2), and can be experimentally determined in advance.

Figure 9B:
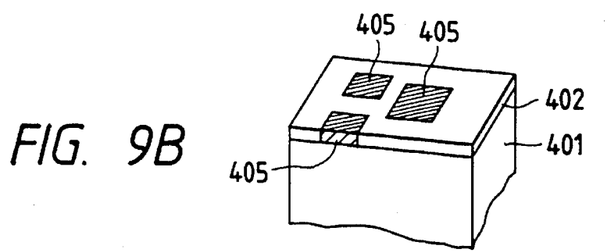

In this process, the substrate surface is heated to ca. 270° C. by direct heating, and the procedure explained above causes selective deposition of an Al film 405 in the aperture, as shown in FIG. 9B.

The foregoing is called a first film forming step for forming an electrode in an aperture.

After said first film forming step, the CVD reaction chamber 312 is evacuated, by the vacuum system 316b, to a pressure not exceeding $5 \times 10^{-3}$ Torr. Simultaneously the Rf etching chamber 313 is evacuated to a pressure not exceeding $5 \times 10^{-6}$ Torr. After confirmation of said evacuations of the chambers, the gate valve 310c is opened, then the substrate is moved from the CVD reaction chamber 312 to the Rf etching chamber 313 by the transport means, and said gate valve is closed. The Rf etching chamber 313 is evacuated to a pressure not exceeding $10^{-6}$ Torr, and is then maintained in argon atmosphere of $10^{-1}$–$10^{-3}$ Torr by argon suply from the supply line 322. The substrate holder 320 is maintained at ca. 200° C., and an Rf power of 100 W is supplied to the Rf etching electrode 321 for about 60 seconds to generate an argon discharge in said chamber 313, whereby the substrate surface is etched with argon ions and the unnecessary surficial layer of the CVD deposited film can be eliminated. The etch depth in this case is about 100 Å, corresponding to the oxide film. Said surface etching of the CVD deposited film, conducted in the Rf etching chamber, may be dispensed with since said surficial layer is free from oxygen etc. as the substrate is transported in vacuum. In such case, the Rf etching chamber 313 may serve for varying the temperature within a short time if there is a significant temperature difference between the CVD reaction chamber 312 and the sputtering chamber 314.

After said Rf etching, the argon supply is terminated, and the Rf etching chamber 313 is evacuated to $5 \times 10^{-6}$ Torr. Then the sputtering chamber is also evacuated to $5 \times 10^{-6}$ Torr or lower, and the gate valve 310d is opened. The substrate is transferred from the Rf etching chamber 313 to the sputtering chamber 314 by the transport means, and said gate valve 310d is closed.

Subsequently, the sputtering chamber is maintained at argon atmosphere of $10^{-1}$–$10^{-3}$ Torr as in the Rf etching chamber 313, and the substrate holder 323 is maintained at 200°–250° C. Argon discharge is induced by a DC power of 5–10 kW to scrape the target of Al or Al—Si (Si: 0.5%) with argon ions, thereby depositing Al or Al—Si onto the substrate with a deposition speed of ca. 10000 Å/min. This is a non-selective deposition step, and is called a second film forming step for forming wirings connected to the electrodes.

After the formation of the metal film of about 5000 Å on the substrate, the argon supply and the DC power application are terminated. The load lock chamber 311 is evacuated to a pressure of $5 \times 10^{-3}$ Torr or lower, then the gate valve 310e is opened and the substrate is moved. After the gate valve 310e is closed, the load lock chamber 311 is supplied with nitrogen gas to the atmospheric pressure. Subsequently the gate valve 310f is opened and the substrate is taken out.

Figure 9C:
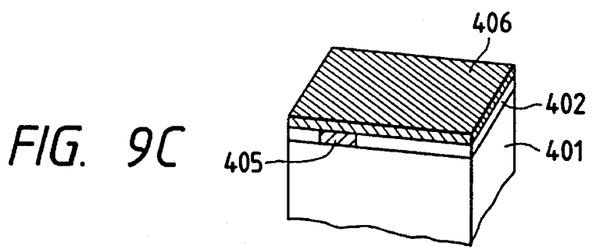

The second Al film deposition step explained above forms an Al film 406 on the $SiO_2$ film 402, as shown in FIG. 9C.

Figure 9D:
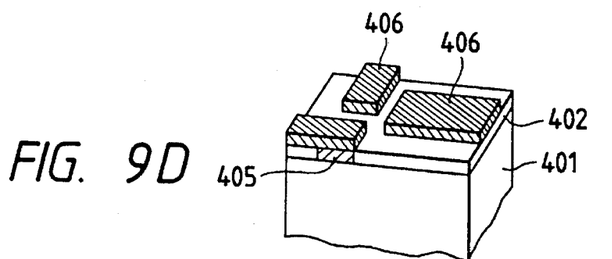

Subsequently said Al film 406 is patterned as shown in FIG. 9D to obtain the wirings of desired shape.

Figure 9E:
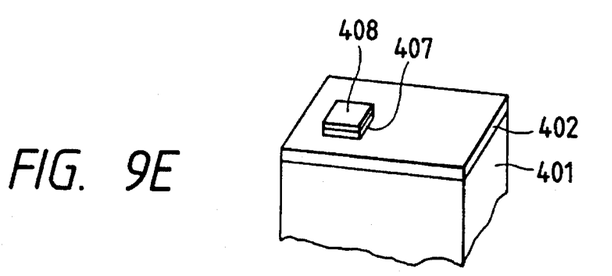

Also an Al film can be deposited selectively on the lateral faces of the $SiO_2$ film 402, by forming monocrystalline or polycrystalline silicon 407 on said film 402, covering the surface thereof with an oxide film 408 thereby exposing the lateral faces, and effecting deposition by the CVD utilizing DMAH and $H_2$, as shown in FIG. 9E.

(Experimental examples)

In the following there will be shown experimental results indicating the superiority of the above-explained Al-CVD method and the satisfactory quality of the Al film deposited by said method in the apertures.

There were prepared plural substrates, each consisting of an N-type monocrystalline silicon wafer, provided thereon with a thermally oxidized $SiO_2$ film of a thickness of 8000 Å, in which apertures of different sizes from 0.25×0.25 μm to 100×100 μm were formed by patterning to expose the underlying monocrystalline silicon (samples 1-1).

These samples were subjected to the Al film formation by the Al-CVD method, employing DMAH as the raw material gas and hydrogen as the reaction gas, with a total pressure of 1.5 Torr and a DMAH partial pressure of $5.0 \times 10^{-3}$ Torr, and with the substrate surface temperatures selected in a range of 200°–490° C. by direct heating under the regulation of electric power supplied to the halogen lamps. The obtained results are summarized in Table 1.

TABLE 1

| Substrate Surface temp. (°C.) | 200 | 230 | 250 | 260 | 270 | 280 | 300 | 350 | 400 | 440 | 450 | 460 | 470 | 480 | 490 |
|---|---|---|---|---|---|---|---|---|---|---|---|---|---|---|---|
| Deposition speed (Å/min.) | ← 1000–1500 →|← 3000–5000 → |
| Throughput (wafer/hr) | ← 7–10 —|— 15–30 → |
| Si linear defects | ← not observed → |
| Carbon content | ← not detected → |
| Resistivity (μΩ cm), | ← 2.7–3.3 →|← 2.8–3.4 → |
| Reflectance (%) | ← 85–95 →|← 90–95 →|← ca. 60 → |
| Hillock (>1 μm) density (cm$^{-2}$) | ← 1–10$^2$ →|← 0–10 →|← 10–10$^4$ → |
| Spike formation (%) (destruction frequency of 0.15 μm junction) | ← 0 →|← 0–30 → |

As will be apparent from Tab. 1, aluminum was deposited in the apertures with a deposition speed as high as 3000–5000 Å/min. at the substrate surface temperature of 260° C. or higher obtained by direct heating.

The Al film in the apertures, obtained in a substrate surface temperature range of 260°–440° C., showed satisfactory characteristics, with no carbon content, a resistivity of 2.8–3.4 μΩcm, a reflectance of 90–95%, a hillock (≧1 μm) density of 0–10 cm$^{-2}$, and an almost zero spike formation (frequency of destruction of 0.15 μm junction).

On the other hand, though the film quality obtained in a surface temperature range of 200°–250° C. was somewhat inferior to that obtained in the temperature range of 260°–440° C., it is considerably better than that obtainable with the conventional technology, but the deposition speed could not exceed 1000–1500 Å/min. and the output was in a relatively low range of 7–10 wafer/hr.

At the substrate surface temperature equal to or higher than 450° C., the quality of the Al film in the apertures deteriorated, with a reflectance of 60% or lower, a hillock (≧1 μm) density of 10–10$^4$ cm$^{-2}$ and an alloy spike formation of 0–30%.

In the following there will be explained how the above-explained method can be advantageously applied to the apertures such as contact holes or through-holes.

Said method can be advantageously applied to to the contact holes or through-holes composed of the materials explained in the following.

The Al film formation was conducted on the following substrates (samples) under the same conditions as in the Al film formation on the above-mentioned samples 1-1.

Samples 1-2 were prepared by forming, on monocrystalline silicon constituting a first substrate surface material, a silicon oxide film constituting a second substrate surface material by means of CVD method, and forming apertures by a photolithographic process to locally expose the surface of monocrystalline silicon. The SiO$_2$ film was 8000 Å thick, and the apertures were sized from 0.25×0.25 μm to 100×100 μm. (Such sample will hereinafter be represented as "CVD SiO$_2$ (or simply SiO$_2$)/monocrystalline silicon".)

There were also prepared:

a sample 1-3 of boron-doped oxide film formed by normal pressure CVD (hereinafter written as BSG)/monocrystalline silicon.

a sample 1-4 of phosphorus doped oxide film formed by normal pressure CVD (PSG)/monocrystalline silicon;

a sample 1-5 of boron- and phosphorus-doped oxide film formed by normal pressure CVD (BSPG)/monocrystalline silicon;

a sample 1-6 of nitride film formed by plasma CVD (P-SiN)/monocrystalline silicon;

a sample 1-7 of thermal nitride film (T-Sin)/monocrystalline silicon;

a sample 1-8 of nitride film formed by low pressure CVD (LP-SiN)/monocrystalline silicon; and a sample 1-9 of nitride film formed by ECD (ECR-SiN)/monocrystalline silicon.

Further, samples 1-11 to 1-179 were prepared by taking all the combinations of the first surface materials of 18 kinds and the second surface materials of 9 kinds shown in the following. (It is to be noted that the sample numbers 1-10, 20, 30, 40, 50, 60, 70, 80, 90, 100, 110, 120, 130, 140, 150, 160, and 170 are lacking.) The first surface materials employed were monocrystalline silicon (mono-Si), polycrystalline silicon (poly-Si), amorphous silicon (a-Si), tungsten (W), molybdenum (Mo), tantalum (Ta), tungsten silicide (WSi), titanium silicide (TiSi), aluminum (Al), aluminum silicon (Al—Si), titanium aluminum (Al—Ti), titanium nitride (Ti—N), copper (Cu), aluminum silicon copper (Al—Si—Cu), aluminum palladium (Al—Pd), titanium (Ti), molybdenum silicide (Mo—Si), and tantalum silicide (Ta—Si). The second substrate surface materials employed were T—SiO$_2$, SiO$_2$, BSG, PSG, BPSG, P-SiN, T-SiN, LP-SiN and ECR-SiN. In all these samples, there could be obtained satisfactory Al films comparable to those in the aforementioned samples 1-1.

Subsequently, the Al was non-selectively deposited by sputtering on the substrates subjected to the selective Al deposition as explained above, and was then patterned.

The Al film obtained by sputtering and the selectively deposited Al film in the apertures showed electrically and mechanically satisfactory contact, because of the improved surface state of the Al film in the apertures.

In the following there will be explained an example of preparation of a NOSFET according to the present invention, with reference to FIGS. 10A to 10F.

Figure 10A:
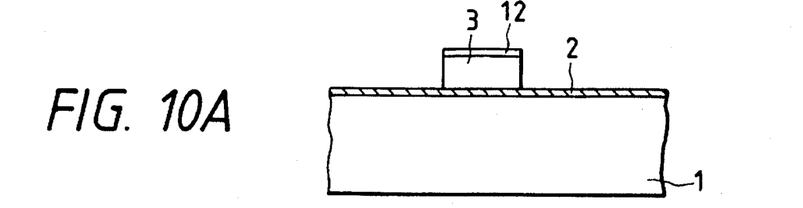
FIGS. 10A to 10F are schematic cross-sectional views showing an embodiment of the present invention.

As shown in FIG. 10A, a gate insulation film 2 of a thickness of 1000 Å was formed on a silicon substrate 1. Subsequently deposited were a polycrystalline silicon film 3 of a thickness of 4000 Å by CVD for forming a gate electrode, and an oxide film 12 of a thickness of 500 Å by CVD, and said oxide film 12 and polycrystalline silicon film 3 were etched into an island by a photolithographic process so as to obtain a gate length of 4 μm.

Figure 10B:
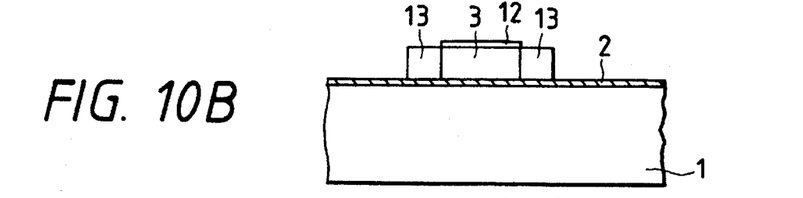

Then, as shown in FIG. 10B, a thin Al film was selectively deposited, by the aforementioned CVD method utilizing DMAH and $H_2$, to a position of 9000 Å from the lateral faces of the polycrystalline silicon film.

Figure 10C:
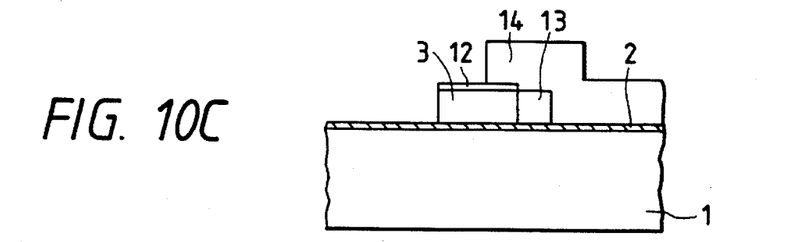

Then, as shown in FIG. 10C, a photoresist layer 14 was formed by coating and patterned, and the Al film on a side of the polycrystalline silicon film 3 was etched off.

Figure 10D:
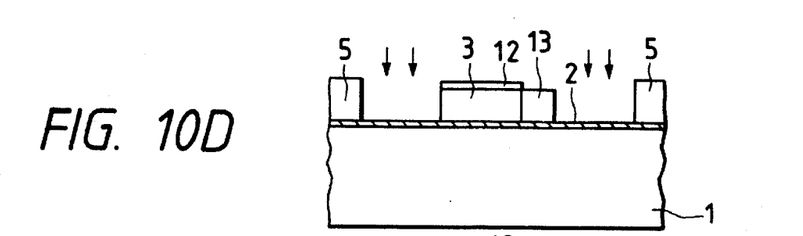

After the removal of the photoresist layer 14, a photoresist layer 5 was formed by coating, and patterned as shown in FIG. 10D, and implantation of phosphorus was conducted with a concentration of $1 \times 10^{15}$ cm$^{-2}$ under an accelerating voltage of 100 keV, utilizing the photoresist 5, polycrystalline silicon film 3 and Al film 13 as the mask, thereby forming a high concentration drain area 8.

Figure 10E:
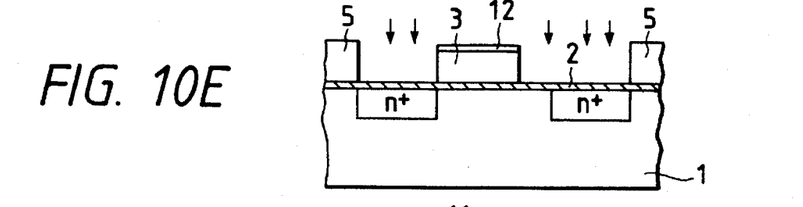

Then, after the Al film 13 was etched off as shown in FIG. 10E, implantation of phosphorus was conducted with a concentration of $1 \times 10^{13}$ cm$^{-2}$ under an accelerating voltage of 100 keV, utilizing the photoresist 5 and polycrystalline silicon film 3 as the mask, thereby forming a low concentration drain area 9.

Figure 10F:
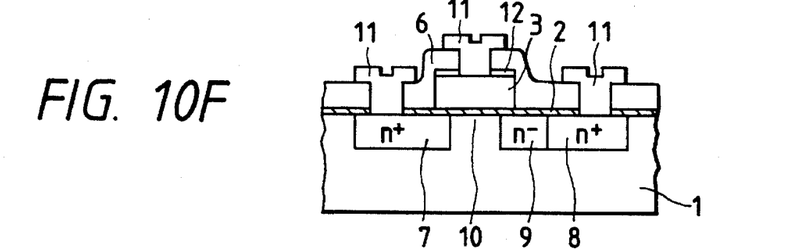

After the removal of the photoresist layer 5 as shown in FIG. 10F, there were subsequently conducted, by an ordinary method, deposition of an intermediate insulation film 6 of a thickness of 8000 Å, an annealing at 950° C., and formation of a source area 7, a drain area 8, a low concentration drain area 9, a channel area 10 and electrodes 11.

The dimensional precision of thus formed low-concentration drain area, or the fluctuation in offset, was 0.05–0.1 μm, so that the fluctuation in the drain voltage resistance could be maintained at 2 V or less.

In the foregoing embodiment, the gate electrode is composed of a polycrystalline silicon film of which principal component is same as that of the substrate, but it may also be composed of other materials commonly used in the gate electrode of MOSFET's, for example silicon materials such as amorphous silicon or monocrystalline silicon, or high-melting metals such as tungsten (W), molybdenum (Mo), tantalum (Ta) or titanium (Ti), or alloys or silicides thereof.

It is also possible to effect the ion implantation of high concentration without the step shown in FIG. 10C thereby leaving the Al film 13 also at the side of the source area 7, and to thereafter form the source area of low impurity concentration by removing the Al film 13 by etching.

The electrodes 11 may be formed for example by sputtering, but those of satisfactory crystalline character may be obtained by selective deposition on the semiconductor substrate by the aforementioned CVD method utilizing DMAH and $H_2$.

The method of the present invention is applicable, not only in the preparation of a semiconductor device on a silicon substrate, but also in the preparation of a semiconductor device on a semiconductor layer formed on an insulating substrate such as a silicon oxide film or a quartz substrate. Furthermore, the method of the present invention is widely applicable to the preparation of a semiconductor device of a structure in which a high concentration doped area and a low concentration doped area are mutually adjacent.

As explained in the foregoing, the present embodiment allows the improvement of the dimensional precision of the low concentration drain area, thereby improving the drain voltage resistance, since a thin Al film is deposited on the lateral faces of the gate electrode in self-aligning manner. Then, the ion implantation for forming the high concentration drain area is conducted utilizing said Al film as a mask, and the ion implantation for forming the low concentration drain area is conducted after the removal of said Al film.

In the above-explained embodiment, the Al-CVD method has been explained in relation to the deposition of a conductive material in a contact hole, but such selective deposition is not limited to aluminum and can also be conducted with other metals shown in Table 2.

For example, in the case of formation of a tungsten film on the substrate with $W(CH_3)_3$ gas and hydrogen gas, the surface temperature of the substrate is preferably maintained within a range from the decomposition temperature of $W(CH_3)_3$ to 700° C., more preferably from 350°–400° C.

A tungsten film of satisfactory quality can be obtained with a high deposition speed, by heating the substrate surface with lamps in the presence of a mixture of such gases.

In such case, with the substrate surface temperature maintained in the more preferred range of 350°–400 ° C. for W film formation, a film of satisfactory quality can be obtained with a deposition speed as high as 3000–5000 Å/min, which is higher than in the case of resistance heating.

TABLE 2

| Metal | Gas | Reaction gas | Deposition temp. |
|---|---|---|---|
| Al | Al—(CH$_3$)$_2$H | H$_2$ | 260–350° C. |
|  | Al—(CH$_3$)H$_2$ | " | 260–350° C. |
| Ti | TiCl$_4$ | " | 260–350°0 C. |
| Cu | Cu—(C$_{11}$H$_{19}$O$_2$)$_2$ | " | 260–350° C. |
|  | Cu—(C$_5$H$_7$O$_2$)$_2$ | " | 260–350° C. |
| W | WF$_6$ | — | 300–700° C. |
|  | W(CH$_3$)$_3$ | H$_2$ | 350–450° C. |
|  | W(C$_2$H$_5$)$_3$ | " | 350–450° C. |
| Mo | Mo(CO)$_6$ | " | 350–450° C. |

The above-explained selective depositing method is usable not only in the filling of the contact hole, but also advantageously in the formation of the above-explained gate electrode structure, since it can selectively deposit, utilizing its excellent selectivity, a metal on the upper and lateral faces of the first electrode portion principally composed of a component same as that of the semiconductor substrate. The metal film thus deposited by this method shows, like the metal film in the contact hole, excellent characteristics desirable for the electrode wirings of the semiconductor device.

In the following there will be explained examples of the present invention, but it is to be understood that the present invention is by no means limited by such examples.

(EXAMPLE 1)

This example describes an N-channel MOS transistor in an inverter circuit.

Figure 11A:
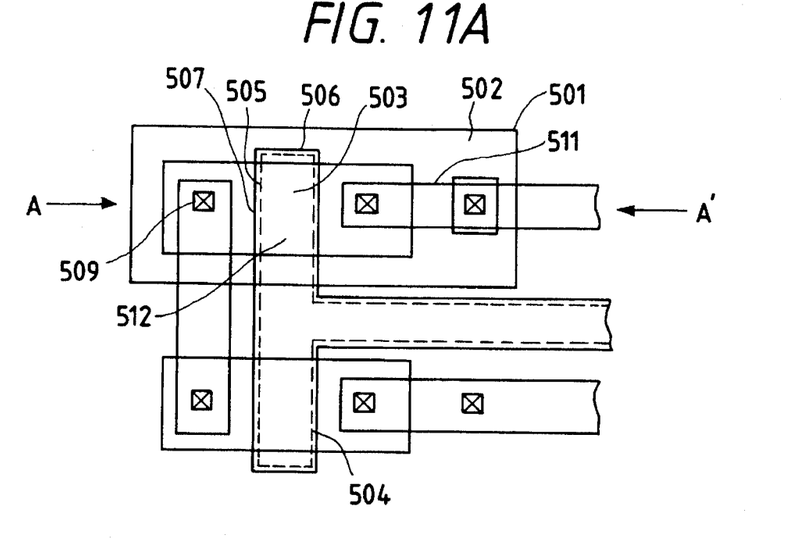
FIG. 11A is a schematic plan view of an inverter circuit embodying the present invention.
Figure 11B:
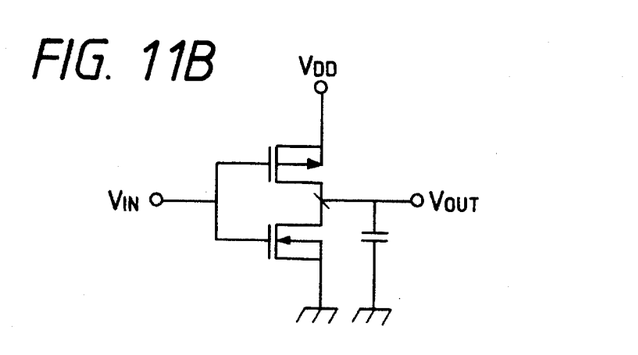
FIG. 11B is a circuit diagram of said inverter circuit.
Figure 11C:
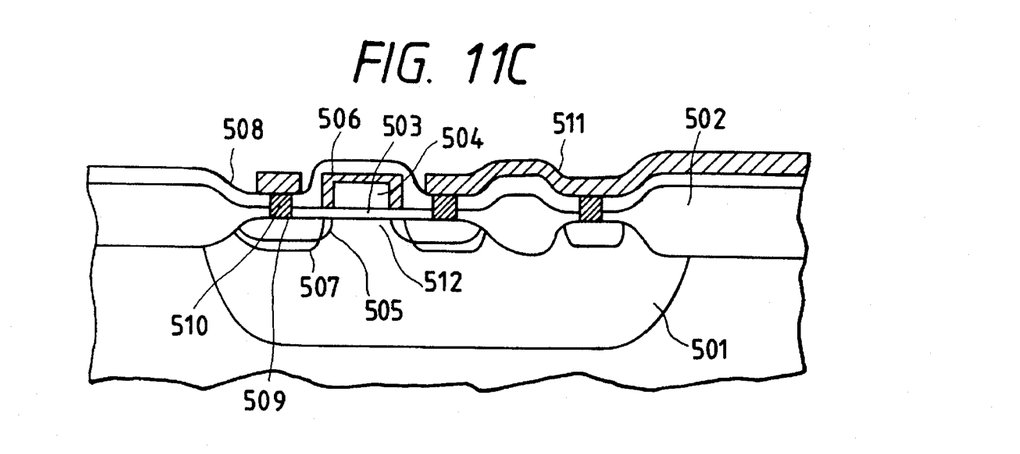
FIG. 11C is a cross-sectional view, along a line A—A in FIG. 7A, showing an NMOS device portion.

FIG. 11A is a plan view of the inverter circuit, FIG. 11B is a circuit diagram thereof, and FIG. 11C is a cross-sectional view, along a line A—A in FIG. 11A, of an NMOS transistor portion in said inverter circuit.

The NMOS transistor is formed in an area surrounded by a P-well 501 and a field oxide film 502. Low impurity concentration areas 505 are formed below and adjacent to a first electrode portion 504, composed for example of polycrystalline silicon and positioned on a gate oxide film 503 between the source and drain area. On the upper and lateral faces of said first electrode portion, a metal film 506 consisting of tungsten (W) is deposited by selective CVD to constitute a gate electrode. Below said metal film 506 there are formed high impurity concentration areas 507, and each of the source and drain areas is composed of a low impurity concentration area 505 and a high impurity concentration area 507. Corresponding to said areas of different impurity concentrations constituting the source and the drain, there are provided the first electrode portion 504 constituting the gate electrode and the metal film 506 covering said gate electrode and constituting a second electrode portion.

The transistor is surfacially covered by an interlayer insulation film 508, and is connected to metal wirings 511 through conductive members 511, for example of aluminum, filled in contact holes 509 for electrode contact with the source and the drain. In order to prevent formation of recesses in aluminum above such contact holes in the above-explained structure, it is effective to selectively deposit aluminum solely in the contact holes by the aforementioned CVD method, thereby filling the contact holes, then depositing the wiring material over the entire surface of the substrate, and patterning said wiring material to complete the wirings.

In the following there will be explained the function of said MOS transistor, in which the conductance of a channel portion 512 between the source and the drain is controlled by the gate electrode 504, 506. With a voltage $V_G$ applied to the gate electrode and a voltage $V_D$ between the source and drain electrodes, a current $I_D$ flows therebetween according to the following equation:

$$I_D = C_{ox} \cdot \mu \cdot \frac{W}{L} \left\{ (V_G - V_{th})V_D - \frac{1}{2} V_D^2 \right\}$$

if $V_D < V_G - V_{th}$, or $$I_D = \frac{1}{2} C_{ox} \cdot \mu \cdot \frac{W}{L} (V_G - V_{th})^2$$

if $V_D > V_G - V_{th}$, wherein $C_{ox}$ is the gate capacitance, $\mu$ is the carrier mobility, W is the channel width, L is the channel length, $V_{th}$ is the threshold voltage, and $V_D$ is the voltage applied to the drain.

Requirements for such MOS transistor are:

1) to relax the electric field intensity between the source and the drain, thereby suppressing the generation of hot electrons;
2) to achieve high-speed transistor functions; and
3) to enable stable manufacture of the transistor satisfying the foregoing requirements.

In the present example, because of the selective deposition of the W film 506 with a uniform thickness of 1500 Å on the upper and lateral faces of the polycrystalline Si, the low impurity concentration area 505 produces from the high impurity concentration area 507 toward the channel portion 512, by a uniform width of ca. 0.15 μm, so that the production yield of the integrated circuit can be drastically improved in comparison with the conventional process utilizing an etch-back step. Also the gate electrode and the wirings practically have a three-layered structure of polycrystalline Si, WSi$_2$ and W, and the presence of the W film finally remaining with a thickness of about 1200 Å reduces the resistance of the gate electrode to about half.

In the following the method for producing the NMOS transistor of the present example will be explained in greater detail, with reference to FIGS. 3A to 3D.

On a silicon substrate, there were formed the P-well 501, an active area surrounded by the field oxide film 502, the gate oxide film 503, and the gate electrode 504 of polycrystalline silicon, by ordinary methods such as thermal oxidation, LOCOS, thermal diffusion, polycrystalline deposition, photolithography etc. Then implantation of impurity ions was conducted, utilizing said gate electrode 504 as the mask, thereby forming the low impurity concentration area 505. The implantation was conducted with phosphorus ions of a concentration of $2\times10^{13}$ cm$^{-2}$, with thermal treatment of 15 minutes at 1000° C. (FIG. 3A).

Then the aforementioned selective deposition was conducted to deposit the W film 506 solely on the upper and lateral faces of the polycrystalline Si film 504, by employing W(CH$_3$)$_3$ and H$_2$ as the reaction gases with respective partial pressures of $2\times10^{-4}$ Torr and 1.5 torr and heating the substrate at 380° C. in the presence of said gases. The thickness of said W film 506 was 1500 Å and uniform on the upper and lateral faces of the polycrystalline Si film 504, and showed little fluctuation among different substrates (FIG. 3B).

Then ordinary ion implantation was carried out to form the high impurity concentration areas 507 in positions retracted by about 1500 Å from the low impurity concentration areas 505, without impurity introduction ion the area covered by the W film 506. More specifically, arsine ions were implanted with a concentration of $5\times10^{15}$ cm$^{-2}$, and rapid thermal annealing was conducted for 20 seconds at 1000° C. for electric activation (FIG. 3C).

A part of tungsten was converted into WSi$_2$ by this heat treatment, but the final profile, analyzed with SIMS, consisted of a polycrystalline Si film of 3100 Å, a WSi$_2$ film of 500 Å and a W film of 1200 Å.

Then a BPSG film 508 was deposited with a thickness of 8000 Å as an interlayer insulation film, and contact holes 509 were opened in the positions of source and drain electrodes, by a method usually employed in the manufacture of semiconductor devices. Subsequently aluminum was selectively deposited solely in the contact holes 509, by means of the aforementioned selective deposition method utilizing DMAH and H$_2$, with a DMAH partial pressure of $1.5\times10^{-4}$ Torr, a total pressure of 1.5 Torr and a substrate temperature of 270° C. (FIG. 3D).

Then the MOS structure was completed by forming the wirings by sputtering.

The characteristics of thus obtained MOS transistor are as follows:

|  | Polycrystalline Si gate electrode | Polycide gate electrode | Present example |
|---|---|---|---|
| Gate electrode resistance | 30 Ω/□ | 3.2 Ω/□ | 1.8 Ω/□ |
| Gate delay time | 700 ps | 90 ps | 55 ps |
| Production yield of 400 K gate device | 82% | 40% | 85% |

(EXAMPLE 2)

The tungsten film in the foregoing example shown in FIG. 3 was replaced by a film of Ti, Cu, W or Mo by the aforementioned selective deposition method respectively utilizing $TiCl_4+H_2$, $Cu(C_{11}H_{19}O_2)_2+H_2$, $WF_6$, $W(C_2H_5)_3+H_2$ or $Mo(CO)_6+H_2$. These metal films provided satisfactory results similar to that in the example shown in FIG. 3.

(EXAMPLE 3)

The tungsten film in the foregoing example shown in FIG. 3 was replaced by an Al film.

More specifically, the Al film was deposited with a thickness of 2000 Å, under the conditions with a DMAH partial presure of $1.5\times10^{-4}$ Torr, a $H_2$ partial pressure of 1.5 Torr and a substrate temperature of 270° C. Then was ion implantation was conducted as in example 1 for forming a high impurity concentration area, and heat treatment was conducted for 10 minutes at 850° C. in a diffusion furnace. Though the deposited aluminum was partly converted into alloy and partly evaporated, the high impurity concentration area and the low impurity concentration area were mutually separated by a distance of about 1.5 µm at the interface, so that the MOS transistor with an LDD structure was enough to prevent the deterioration by hot electrons and could be obtained in stable manner.

As explained in the foregoing, the present embodiment allows the formation of the lateral wall films, which are important components in the LDD structure, in uniform and stable manner without the conventional etch-back step, by selectively depositing a metal on the upper and lateral walls, for example, of a polycrystalline silicon electrode. It is therefore rendered possible to produce the LDD structure, as a countermeasure for hot electrons, in stable manner and with a high production yield, and also to obtain devices with improved surface flatness. Besides, a semiconductor device with improved response speed can be obtained, since the laminate structure of polycrystalline silicon and metal film significantly reduces the specific resistivity of the gate electrodes and the wirings therefor. Furthermore, compactization of the device can be achieved by the use of selection deposition in the deposition of metal on the gate electrodes and in the filling of the contact holes with a conductive material.

What is claimed is:

1. In a method for fabricating a semiconductor device comprising:

(i) a semiconductor substrate;

(ii) source and drain regions formed within said semiconductor substrate;

(iii) a gate insulating film provided on said semiconductor substrate, (iv) a first gate electrode provided on said gate insulating film; and (v) a second gate electrode covering an upper surface and both side surfaces of said first gate electrode, the improvement which comprises:

(a) forming said first gate electrode;

(b) implanting an impurity using said first gate electrode as a mask to form first regions in said semiconductor substrate for forming said source and drain regions;

(c) forming said second gate electrode by selective chemical vapor deposition employing hydrogen gas and at least one gas selected from the group consisting of $TiCl_4$, $Cu(C_{11}H_{19}O_2)_2$, $Cu(C_5H_7O_2)_2$, $W(CH_3)_3$, $W(C_2H_5)_3$, $Mo(CO)_6$ and alkylaluminum hydride; and (d) implanting an impurity using said second gate electrode as a mask to form second regions in which impurity concentrations are higher than in said first regions in said semiconductor substrate, wherein there is a self-alignment between edge portions of said first and second regions with the first and second gate electrodes.

2. The method according to claim 1, wherein said first gate electrode is made of a material selected from the group consisting of semiconductor, metal, alloy and silicide.

3. The method according to claim 1, wherein said first gate electrode is made of a material selected from the group consisting of Al, Ti, Cu, W and Mo.

4. The method according to claim 2, wherein said first gate electrode is made of polysilicon.

5. The method according to claim 1, wherein said gas forming said second gate electrode is dimethylaluminum-hydride.

6. The method according to claim 1, further comprising the steps of providing said gate insulating film with an opening onto said source and drain regions and depositing a metal within said opening of the gate insulating film.

7. The method according to claim 6, further comprising depositing a wiring on the metal and on the gate insulating film.

8. The process according to claim 6, wherein said metal is deposited by chemical vapor depositing employing an alkylaluminum hydride and $H_2$.

* * * * *